United States Patent [19]
Takahashi et al.

[11] Patent Number: 5,139,459
[45] Date of Patent: Aug. 18, 1992

[54] CLEAN TRANSFER METHOD AND SYSTEM THEREFOR

[75] Inventors: Tetsuo Takahashi; Eisaku Miyauchi, both of Akita; Toshihiko Miyajima, Saku, all of Japan

[73] Assignee: TDK Corporation, Japan

[21] Appl. No.: 662,556

[22] Filed: Feb. 28, 1991

[30] Foreign Application Priority Data

Oct. 22, 1990 [JP] Japan .................. 2-281997

[51] Int. Cl.⁵ ........................... B65G 65/00
[52] U.S. Cl. .................. 454/187; 118/719; 204/298.25; 414/217; 414/786
[58] Field of Search ............. 98/36, 87, 115.1, 115.3; 118/719; 204/298.25; 414/217, 786

[56] References Cited
U.S. PATENT DOCUMENTS

| | | | |
|---|---|---|---|
| 4,674,939 | 6/1987 | Manley et al. | 414/217 X |
| 4,724,874 | 2/1988 | Parikh et al. | 414/217 X |
| 4,732,527 | 3/1988 | Conche | 414/217 X |
| 4,897,963 | 2/1990 | Reboul et al. | 414/217 X |
| 4,948,979 | 8/1990 | Munakata et al. | 414/217 X |

*Primary Examiner*—Harold Joyce
*Attorney, Agent, or Firm*—Lerner, David, Littenberg, Krumholz & Mentlik

[57] ABSTRACT

A clean transfer method capable of safely transferring a semiconductor or the like to various apparatus for treating the semiconductor while keeping the environment clean. In the method, the semiconductor is transferred between a vacuum clean box arranged in a clean room and kept at the degree of vacuum of 1 Torr or less and a vacuum chamber arranged in a maintenance room while transfer ports of the vacuum clean box and vacuum chamber are kept air-tightly connected to each other. The vacuum clean box is movably arranged.

17 Claims, 6 Drawing Sheets

CLEAN TRANSFER METHOD AND SYSTEM THEREFOR

BACKGROUND OF THE INVENTION

This invention relates to a clean transfer method and a system therefor, and more particularly to a transfer method which permits components or elements required for the processing and/or assembling of a product associated with a semiconductor to be transferred while being kept clean or free of any contaminant and a system therefor.

A conventional clean transfer method is generally practiced in such a manner as shown in FIGS. 1 and 2. More particularly, a closed space 110 is divided into a maintenance room 112 and a clean room 114 by means of a partition 116. The maintenance room 112 is open to an ambient atmosphere and provided therein with various apparatus 118 used for a precision thin film-forming process required for manufacturing a semiconductor.

The clean room 114 is kept at an air cleanliness ranging from classes 100 to class 10. The words "class 100" used herein indicate a cleanliness having 100 or less particles of 0.5 μm or larger in size contained in one cubic foot of air and the words "class 10" indicate a cleanliness having 10 or less particles of 0.5 μm or larger in size contained in one cubic foot of air. An air stream is blown down from a ceiling of the clean room 114 through a filter 120 into the clean room. The air stream is then outwardly exhausted through a floor 122 formed into a grating construction. In the so-constructed clean room 114 a clean shuttle 124 which is kept at a cleanliness ranging from classes 10 to 1 is movably arranged. The words "class 1" indicate a cleanliness having 1 or less particle of 0.5 μm or larger in size contained in one cubic foot of air. The apparatus 118 are each provided with a transfer port which is open to the surface of the partition facing the clean room 114. A vicinity 126 of each transfer port opening is locally kept at a cleanliness ranging from classes 10 to 1.

The delivery of a transferred object 128 such as a semiconductor wafer or the like between the clean shuttle 124 and the apparatus 118, as shown in FIG. 2, is carried out by introducing the transferred object 128 from the clean shuttle 124 through the vicinity 126 of the periphery of the transfer port locally kept at a cleanliness ranging from classes 10 to 1 to a load lock chamber 130 of the apparatus 118 serving as a preliminary vacuum chamber, closing a shutter of the transfer port on the side of the apparatus to evacuate the preliminary vacuum chamber, and transferring the transferred object 128 to a vacuum chamber 132 of the apparatus 118.

In the conventional clean transfer method shown in FIGS. 1 and 2, the clean room 114 must be kept at a cleanliness as high as classes ranging from 100 to 10 and formed so as to define a large space therein. Unfortunately, much cost is required to keep the clean room 114 at a high cleanliness while maintaining the large space therein. Also, in the conventional clean transfer method, it is required to provide the load lock chamber 130 for receiving the transferred object on the side of the apparatus 118 provided with the vacuum chamber 132, as well as to evacuate the load lock chamber 130 to vacuum. This causes the side of the apparatus to be complicated in structure. In addition, it is substantially impossible to improve the cleanliness to a degree sufficient to render the number of airborne particles substantially near zero. In particular, there is a possibility that particles will contaminate the transferred object during the delivery of the object between the clean shuttle 124 and the apparatus 118.

Another conventional clean transfer method has been proposed and comprises a multi-chamber system as shown in FIG. 3. The multi-chamber system is so constructed that a single load lock chamber provided for accessing a transferred object such as a semiconductor wafer or the like therethrough is commonly used for a sputtering apparatus 134, a CVD apparatus 136, an etching apparatus 138 and the like.

Unfortunately, a clean transfer method using the multi-chamber system shown in FIG. 3 has the following disadvantages: it is impossible to increase the number of apparatus to be arranged in the system, the apparatus cannot be freely arranged, and maintenance is troublesome.

The assignee proposed a clean transfer method as disclosed in Japanese Patent Application Laid-Open Publication No. 28047/1988. However, the publication fails to consider the degree of vacuum in a clean chamber.

SUMMARY OF THE INVENTION

The present invention has been made in view of the foregoing disadvantages of the prior art while taking notice of the fact that, as a result of an experiment by the inventors, in processes relating to a semiconductor such as vapor deposition, sputtering, ion implantation and the like, an improvement in degree of vacuum to 1 Torr or less effectively prevents floating of particles.

Accordingly, it is an object of the present invention to provide a clean transfer method which is capable of safely transferring a transferred object such as a semiconductor wafer or the like to various apparatus each provided with a vacuum chamber while keeping the environment clean.

It is another object of the present invention to provide a clean transfer method which is capable of being effectively directed to various applications, such as the formation of a thin film with high precision.

It is a further object of the present invention to provide a clean transfer method which is capable of being efficiently applied to the manufacturing of a super-precision component to improve the yields thereof.

It is still another object of the present invention to provide a clean transfer method which is capable of exhibiting flexibility sufficient to permit diversified small-quantity production to be accomplished.

It is yet another object of the present invention to provide a clean transfer method which is capable of permitting a system used for practicing the method to be simplified in structure.

It is even another object of the present invention to provide a clean transfer system which is capable of being effectively used for various applications, such as the formation of a thin film with high precision.

It is a still further object of the present invention to provide a clean transfer system which is capable of being efficiently applied to the manufacturing of a super-precision component to improve the yields thereof.

It is a yet further object of the present invention to provide a clean transfer system which is capable of exhibiting flexibility sufficient to permit diversified small-quantity production to be accomplished.

In accordance with one aspect of the present invention, a clean transfer method is provided. The clean transfer method comprises the step of transferring a transferred object such as a semiconductor wafer or the like between a vacuum clean box kept at the degree of vacuum of 1 Torr or less and a vacuum chamber while keeping transfer ports of the vacuum clean box and vacuum chamber air-tightly connected to each other.

In accordance with another aspect of the invention, a clean transfer system is provided. The clean transfer system comprises a vacuum clean box kept at the degree of vacuum of 1 Torr or less and a vacuum chamber. The vacuum clean box and vacuum chamber are provided with transfer ports through which the vacuum clean box and vacuum chamber are air-tightly connected to each other, respectively.

In the present invention constructed as described above, the transferred object is transferred between the vacuum clean box kept at the degree of vacuum of 1 Torr or less and the vacuum chamber while air-tightly connecting the respective transfer ports of the vacuum clean box and vacuum chamber to each other, so that it is not required to keep a clean room in which the vacuum clean box having a good cleanliness is moved. More specifically, the clean room is merely required to be kept at a cleanliness as low as class 10,000. The words "class 10,000" indicate a cleanliness having 10,000 or less particles of 0.5 $\mu$m or larger in size contained in one cubic foot of air. Thus, the clean room can have a simplified structure. More particularly, the present invention permits the above-described floor of a grating configuration required in the prior art to be eliminated from the clean room, resulting in the structure of the clean room being highly simplified so that its cost can be reduced. Also, the present invention permits the transferred object to be carried while keeping the environment in which the object is transferred clean, to thereby realize the formation of a thin film with high precision. Further, the present invention does not restrict the way that the apparatus for processing or treating the transferred object is arranged, to thereby exhibit flexibility sufficient to accomplish diversified small-quantity production.

BRIEF DESCRIPTION OF THE PREFERRED EMBODIMENT

These and other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENT

Figure 1:
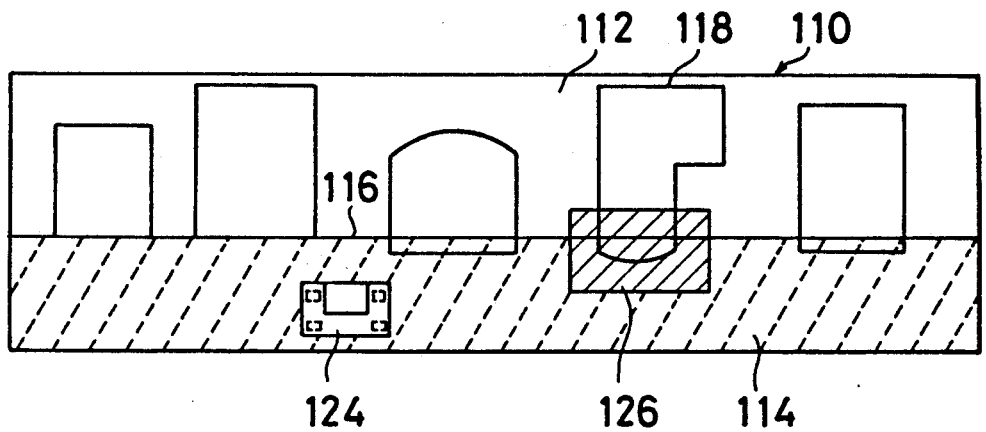
FIG. 1 is a plan view showing a conventional clean transfer method and a system therefor.

Now, a clean transfer method and a system therefor according to the present invention will be described hereinafter with reference to FIGS. 4 to 9, wherein like reference numerals designate like or corresponding parts throughout.

As shown in FIGS. 4 to 7, a closed space 10 is divided into a maintenance room 12 open to or communicating with an ambient atmosphere and a simplified clean room 14 by means of a partition 16. The clean room 14 may be kept at a cleanliness somewhat higher than the maintenance room 12. In the maintenance room 12 various apparatus 18 used for precision thin film formation and the like carried out for the manufacturing of a semiconductor are arranged. The apparatus 18 are each provided with a vacuum chamber 20.

Figure 2:
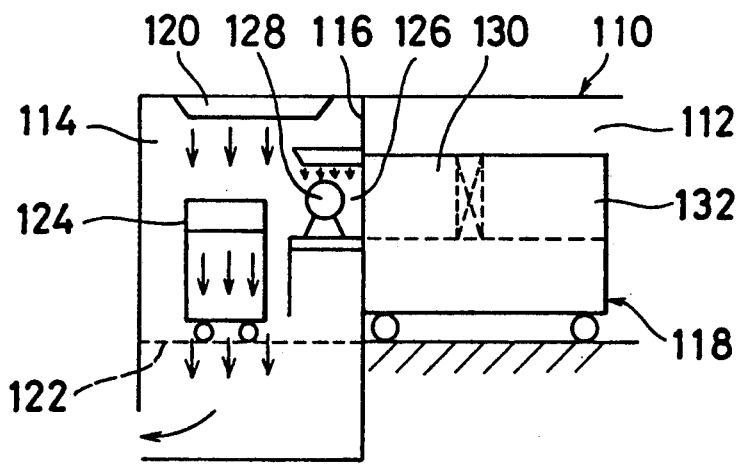
FIG. 2 is a schematic side elevation view of the clean transfer system shown in FIG. 1.
Figure 3:
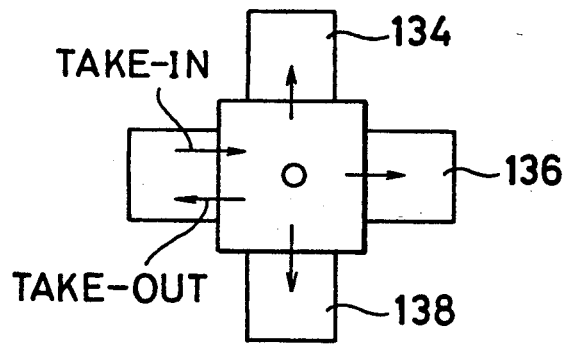
FIG. 3 is a plan view showing a conventional multi-chamber system.
Figure 4:
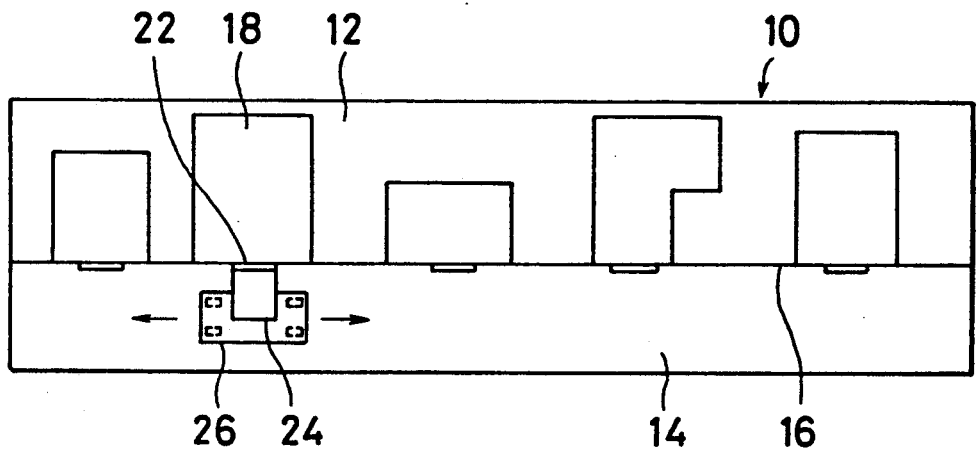
FIG. 4 is a schematic plan view showing an embodiment of a clean transfer method and a system therefor according to the present invention.
Figure 5:
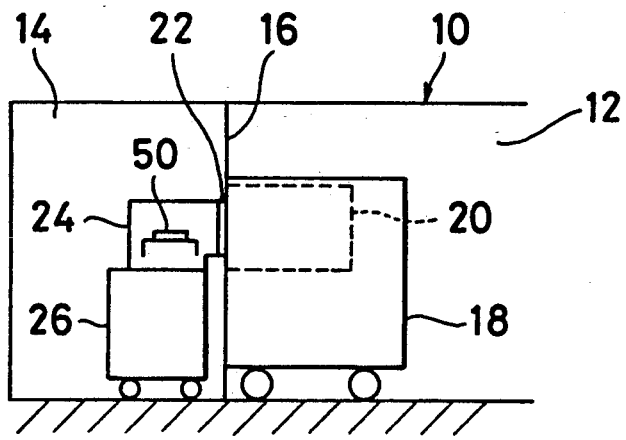
FIG. 5 is a schematic side elevation view of the clean transfer system shown in FIG. 4.

The cleanliness of the simplified clean room 14 may be kept as low as about class 10,000, therefore, it is not necessary for the clean room 14 to be provided with such a floor of a grating structure as required in the prior art shown in FIG. 2. Thus, it is merely required to provide the clean room 14 with a simple dust-proof means. The partition 16 is provided on the surface thereof facing the simplified clean room 14 with a flanged transfer port 22 for the apparatus 18. In the simplified clean room 14 a vacuum clean box 24 is movably arranged and mounted on a carriage 26 or the like. Thus, the simplified clean room 14 is used as a transfer room for transferring a transferred object. Alternatively, the vacuum chamber 20 or both the vacuum chamber 20 and vacuum clean box 24 may be movably arranged. The vacuum clean box 24 is evacuated to the degree of vacuum of 1 Torr or less, to thereby keep it clean. For this purpose, the vacuum clean box 24 per se may be provided with a vacuum evacuation system. Alternatively, a vacuum evacuation means may be separately arranged so as to communicate with the vacuum clean box 24, resulting in the vacuum clean box being evacuated to the degree of vacuum of 1 Torr or less when the use of the box 24 is started. Also, the vacuum chamber 20 as well as the vacuum clean box 24 may be kept at the degree of vacuum of 1 Torr or less.

Figure 6:
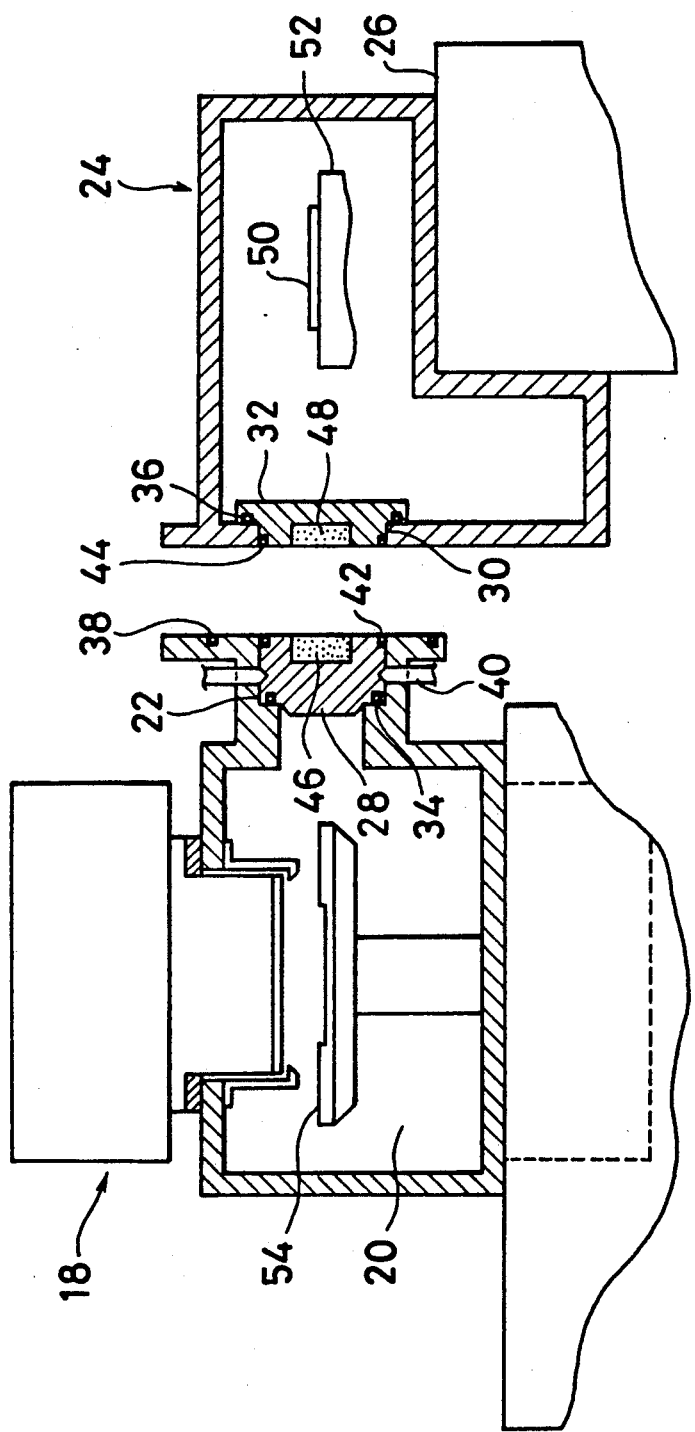
FIG. 6 is a side elevation view showing a vacuum clean box and a vacuum chamber prior to the connection therebetween.
Figure 7:
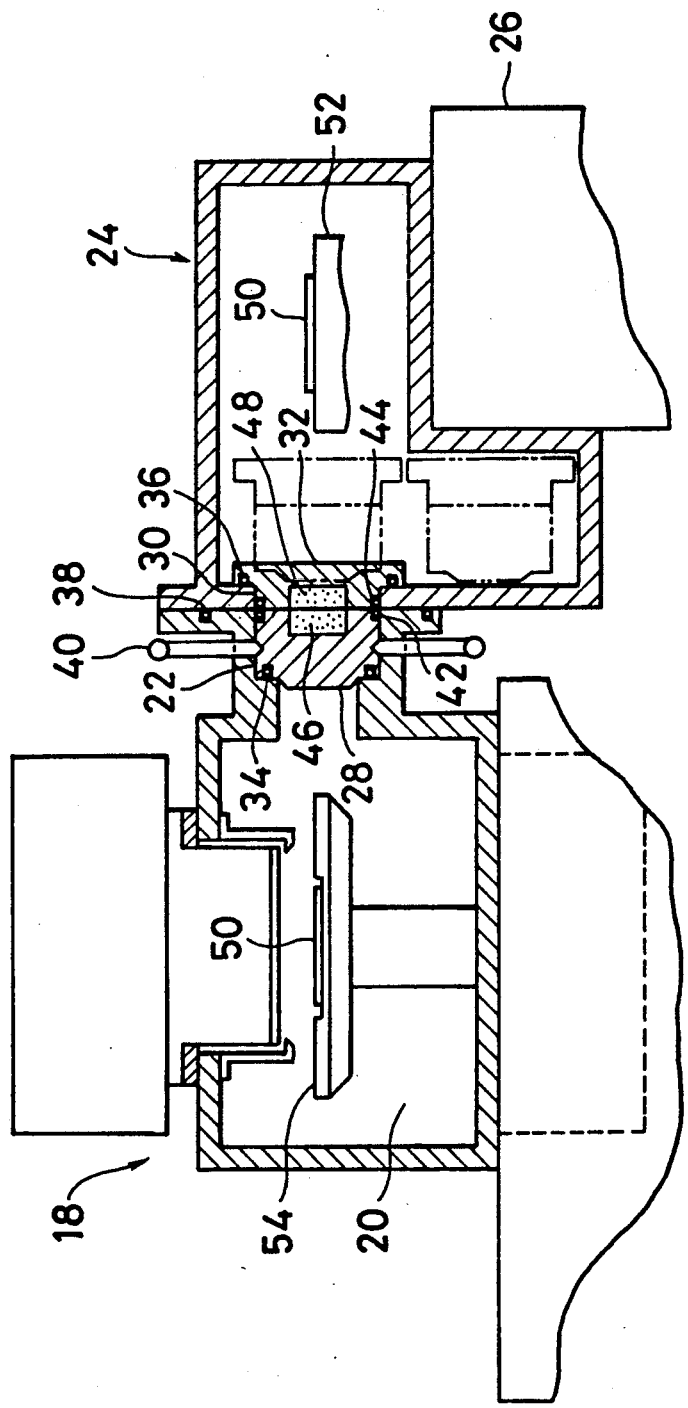
FIG. 7 is a side elevation view showing a vacuum clean box and a vacuum chamber which are connected to each other.

As shown in FIGS. 6 and 7, in the flanged transfer port 22 of each apparatus 18 provided with the vacuum chamber 20 is fittedly arranged a shutter 28 in an air-tight manner. The vacuum clean box 24 is provided with a transfer port 30, in which a shutter 32 is fittedly arranged in an air-tight manner. For the purpose of ensuring air-tightness between the shutter 28 and the transfer port 22 and that between the shutter 32 and the transfer port 30, the shutters 28 and 32 are provided with O-rings 34 and 36, respectively. Also, the transfer port 22 on the side of the apparatus 18 is provided on an abutting surface thereof or a flange surface thereof with an O-ring 38. Further, the flange of the transfer port 22 is provided on the rear surface thereof with lock members 40 for locking the shutter 28 with respect to the port 22. In addition, the shutter 28 is provided on an abutting surface thereof with an O-ring 42 and likewise the shutter 32 is provided on an abutting surface thereof with an O-ring 44. Moreover, in the shutters 28 and 32 are embedded permanent magnets 46 and 48, respectively, through which both shutters are connected to each other as desired. The transfer ports 22 and 30 provided respectively with the shutters 28 and 32 may each be formed into a double-gate valve structure.

Figure 8:
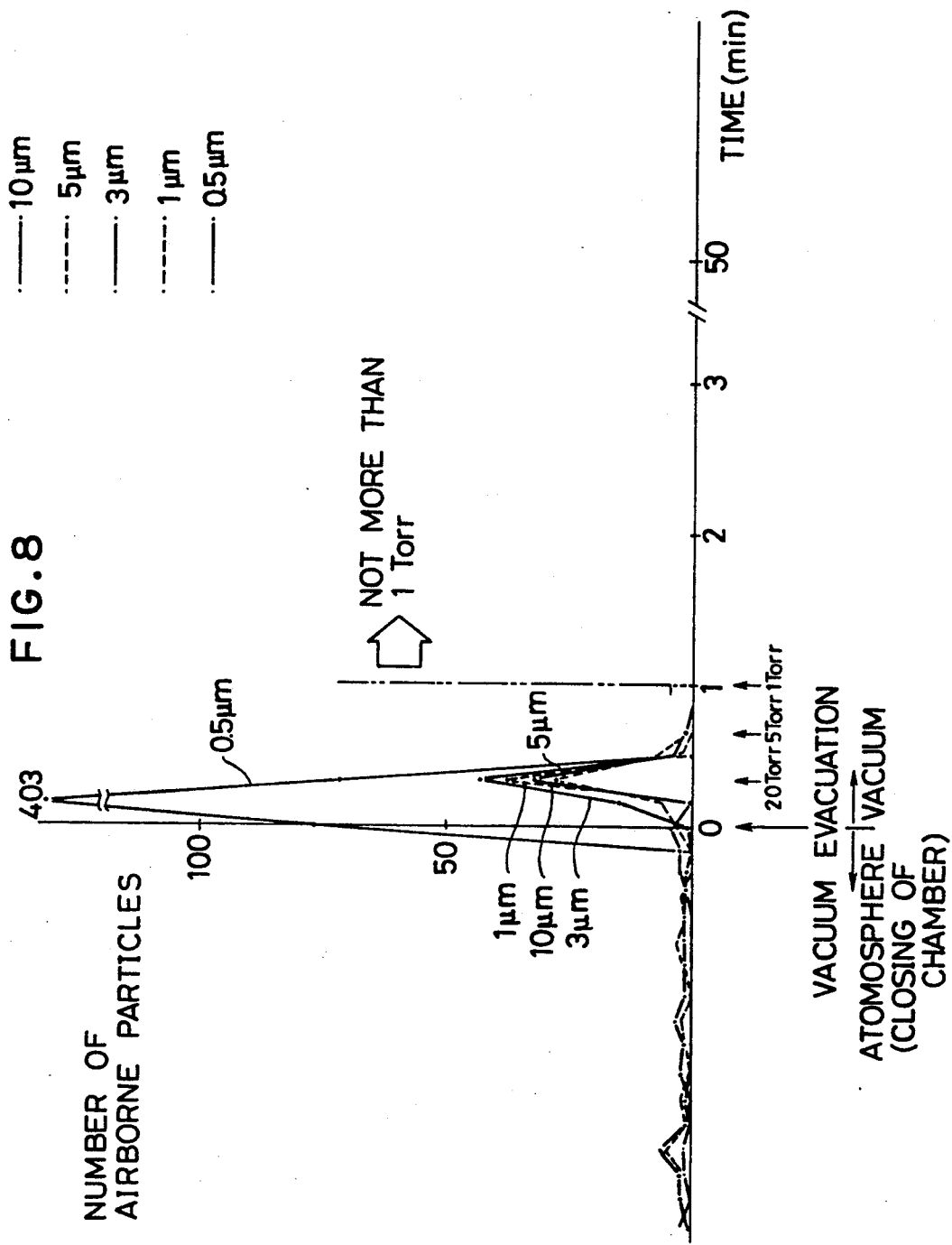
FIG. 8 is a graphical representation showing relationships between the number of dusts floating in a chamber and the degree of vacuum of the chamber.
Figure 9:
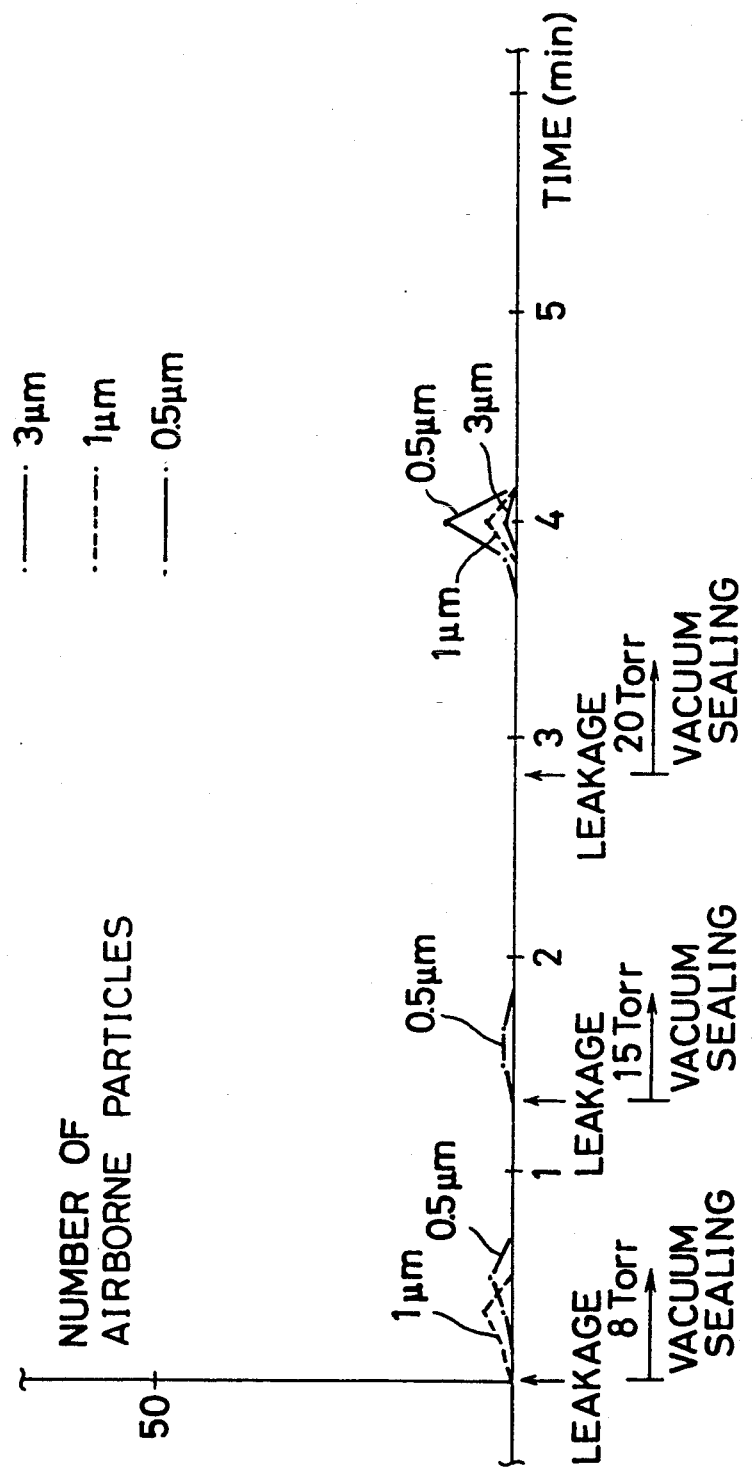
FIG. 9 is a graphical representation showing the number of airborne particles when air leakage occurs in a chamber kept vacuum-sealed.

The degree of vacuum in the vacuum clean box 24 is kept at a level of 1 Torr or less. Now, reference will be made to FIGS. 8 and 9. FIG. 8 shows the number of airborne particles of 10 μm, 5 μm, 3 μm, 1 μm and 0.5 μm in size counted when an experimental chamber open to an ambient atmosphere was closed at 0 minute and then evacuated to vacuum through a vacuum evacuation system. As will be noted from the results shown in FIG. 8, the floating of particles in the experimental chamber is observed when it is evacuated to 20 Torr or 5 to several Torr, however, the floating of particles is never observed when the chamber is evacuated to 1 Torr or less. FIG. 9 shows the number of airborne particles counted immediately after a slight amount of air was introduced, by leakage, into the experimental chamber which was vacuum-sealed. This first leakage results in the degree of vacuum in the chamber or the pressure in the chamber to rapidly increase to 8 Torr, then to 15 Torr after a second leakage, and finally to 20 Torr after a third leakage, the number of airborne particles being counted immediately after each leakage. FIG. 9 indicates that an increase in pressure in the chamber to several Torr or more due to introduction of air into the chamber by leakage causes the floating of particles to occur therein.

Thus, as can be seen from FIGS. 8 and 9, the evacuation of the chamber to 1 Torr or less prevents the floating of particles in the chamber, however, an increase in pressure in the chamber to more than 1 Torr, for example, several to 5 or 8 Torr, causes particles to float in the chamber.

Now, the manner of transferring a transferred object 50 such as a semiconductor wafer will be described hereinafter. First, the vacuum clean box 24 is previously evacuated to a degree of vacuum as good as 1 Torr or less to prevent any particles from floating in the chamber. Then, the transferred object 50, as shown in FIG. 6, is put on a support 52 arranged in the vacuum clean box 24. Then, as shown in FIG. 7, the transfer port 22 of the vacuum chamber 20 on the side of the apparatus 18 is pressedly contacted with the transfer port 30 on the side of the clean box 24 through their abutting surfaces, so that both transfer ports 22 and 30 may be connected to each other in an air-tightly sealed manner. Concurrently, the above causes the shutters 28 and 32 to face each other through their abutting surfaces by the action of the permanent magnets 46 and 48, so that the O-rings 42 and 44 cause air between the abutting surfaces of the shutters 28 and 32 to be sealedly held therebetween. Then, the lock members 40 are released to remove the mutually connected shutters 28 and 32 as indicated by phantom lines in FIG. 7, to thereby cause the transfer ports 22 and 30 to communicate with each other. Subsequently, the transferred object 50 on the side of the vacuum clean box 24 is moved to a predetermined position on the side of the apparatus 18 such as, for example, onto a holder 54 arranged in the vacuum chamber 20 on the side of the apparatus. The transfer of the transferred object 50 from the side of the apparatus to the side of the vacuum clean box likewise may be carried out in substantially the same manner while keeping the transfer ports 22 and 30 air-tightly connected to each other as shown in FIG. 7.

The shutters 28 and 32 can be removed while being air-tightly held together, so that the removal of the shutters does not cause the leakage of air into the system. Also, the vacuum chamber 20 on the side of the apparatus 18 is kept at high vacuum of 1 Torr or less; thus, the communication between the vacuum chamber 20 on the side of the apparatus and the vacuum clean box 24 does not cause the degree of vacuum in the vacuum clean box 24 to be more than 1 Torr, resulting in the vacuum clean box being effectively used for transferring the next transferred object without being further evacuated.

As can be seen from the foregoing, the present invention permits a transferred object such as a semiconductor wafer or the like to be carried while keeping the transfer port of the vacuum clean box kept at the degree of vacuum of 1 Torr or less and the transfer port of the vacuum chamber air-tightly connected to each other, so that the transfer of the object may be carried out while keeping the environment clean or free of any airborne particle. Thus, the present invention can be effectively applied to the high precision formation of a thin film and the like, and thus it can be fully applied to the manufacturing of a super-precision element, such as the type of semiconductor expected in the future, while improving the yields thereof. Also, the present invention permits the number of vacuum clean boxes and vacuum chambers to be varied as desired, resulting in it exhibiting flexibility sufficient to permit diversified small-quantity production to be attained. Further, in the present invention, the cleanliness of the chamber in which the vacuum clean box is moved can be kept at a relatively low level, to thereby significantly simplify the structure. Moreover, the transferred object is carried directly from the vacuum clean box to the vacuum chamber, so that the load lock chamber required in the prior art or the like may be eliminated, to thereby further simplify the structure.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method of cleanly transferring an object between a first vacuum chamber and a second vacuum chamber, said first vacuum chamber having a first transfer port which is closed by a first moveable shutter, and said second vacuum chamber having a second transfer port which is closed by a second movable shutter, said method comprising the steps of:
   operating said second vacuum chamber at substantially vacuum,
   hermetically connecting said first transfer port to said second transfer port, whereby said first movable shutter is coupled to said second movable shutter,
   disposing said coupled first and second movable shutters in one of said vacuum chambers, such that said first vacuum chamber is in hermetically sealed communication with said second vacuum chamber and through said first and second transfer ports, and transferring an object form one of said vacuum chambers to said other of said vacuum chambers while said transfer ports are hermetically connected.

2. The method of claim 1, wherein said substantial vacuum comprises about 1 Torr or less.

3. The method of claim 2, wherein said object to be transferred comprises a semiconductor wafer.

4. A clean transfer system comprising
a first vacuum chamber having a first transfer port, and a first movable shutter closing said first transfer port, and
a second vacuum chamber having a second transfer port, and a second movable shutter closing said second transfer port, said second vacuum chamber operating at substantially vacuum,
said first and second transfer ports being capable of hermetically connecting with each other and for allowing said first vacuum chamber to communicate with said second vacuum chamber, and said first and second movable shutters being capable of coupling and decoupling with each other, whereby said coupled first and second movable shutter may be disposed in one of said first and second vacuum chambers.

5. The clean transfer system of claim 4 wherein said second vacuum chamber operates at about 1 Torr or less.

6. A method of cleanly transferring an object between a first vacuum chamber and a second vacuum chamber, said first vacuum chamber being disposed in a first room and said second vacuum chamber being disposed in a second room, said first room and said second room being isolated from each other, said second vacuum chamber having a second transfer port, and said first vacuum chamber having a first transfer port capable of communicating with said second room, said method comprising the steps of
maintaining said first and second rooms such that the number of airborne particles in said second room are less than the number of airborne particles in said first room, and maintaining said first room with an ambient atmosphere,
operating said second vacuum chamber at substantially vacuum,
hermetically connecting said first transfer port to said second transfer port, and
transferring an object between said first and second vacuum chambers while said first and second transfer ports are hermetically connected.

7. The method of claim 6 wherein said first transfer port includes a first moveable shutter, and said second transfer port includes a second movable shutter, and said method further comprising the steps of
coupling said first shutter to said second shutter, and
disposing said first and second coupled shutters in one of said vacuum chambers, such that said first vacuum chamber is in communication with said second vacuum chamber.

8. The method of claim 7, wherein said second vacuum chamber comprises a plurality of said second vacuum chambers, said first vacuum chamber is moveably disposed with respect to said plurality of second vacuum chambers, and said first vacuum chamber is capable of selectively hermetically connecting with each of said plurality of second vacuum chambers.

9. The method of claims 6 or 8, wherein said second vacuum chamber is operated at 1 Torr or less.

10. The method of claim 9, wherein said object to be transferred is a semiconductor wafer.

11. A clean transfer system comprising
a first room open to an ambient atmosphere,
a second room isolated from said first room, said second room having a smaller number of airborne particles than said first room,
a first vacuum chamber disposed in said first room,
a second vacuum chamber disposed in said second room and operating at substantially vacuum,
a first transfer port disposed on said first vacuum chamber, and
a second transfer port disposed on said second vacuum chamber,
means for hermetically connecting said first and second transfer ports with each other for allowing said first vacuum chamber to communicate with said second vacuum chamber.

12. A clean transfer system of claim 11, wherein said first and second rooms are separated by partition means and wherein said first transfer port is arranged at a location of said first room corresponding to said partition means.

13. A clean transfer system as defined in claim 12 wherein said first vacuum chamber comprises apparatus for processing a transferred object.

14. A clean transfer system as defined in claim 13 wherein said first room comprises a maintenance room, and said second room comprises a transfer room.

15. A clean transfer system as defined in claim 11 wherein said first transfer port includes a first moveable shutter and said second transfer port includes a second movable shutter, said first and second movable shutters being capable of coupling and decoupling with each other to allow said first vacuum chamber to communicate with said second vacuum chamber.

16. A clean transfer system as defined in claim 11 wherein said second vacuum chamber is moveable.

17. A clean transfer system as defined in claim 11 wherein said first vacuum chamber comprises a plurality of first vacuum chambers including a corresponding plurality of said first transfer ports, and said second transfer port is capable of connecting with each of said plurality of first transfer ports.

* * * * *